ID [19] United States Patent
Violette et al.

[11] Patent Number: 6,140,214
[45] Date of Patent: Oct. 31, 2000

[54] SEMICONDUCTOR PROCESSING METHODS, SEMICONDUCTOR PROCESSING METHODS OF FORMING DIODES, AND SEMICONDUCTOR PROCESSING METHODS OF FORMING SCHOTTKY DIODES

[75] Inventors: Michael P. Violette; Fernando Gonzalez, both of Boise, Id.

[73] Assignee: Micron Technology, Inc., Boise, Id.

[21] Appl. No.: 09/141,541

[22] Filed: Aug. 28, 1998

[51] Int. Cl.$^7$ ................................................. H01L 21/425
[52] U.S. Cl. ............................................. 438/525; 438/525
[58] Field of Search .................................... 438/525, 302, 438/583, 570, 581, 582, 414, 420, 140, 167

[56] References Cited

U.S. PATENT DOCUMENTS

| | | | |
|---|---|---|---|
| 3,801,365 | 4/1974 | Hrzek | 438/538 |
| 3,873,371 | 3/1975 | Wolf | 438/302 |
| 4,864,378 | 9/1989 | Tsaur | 438/527 |
| 5,087,322 | 2/1992 | Lillienfeld et al. | 438/525 |
| 5,726,069 | 3/1998 | Chen et al. | 438/302 |

OTHER PUBLICATIONS

U.S. application No. 08/920,535, Honeycutt et al., filed Aug. 29, 1997.

Primary Examiner—David Nelms
Assistant Examiner—Dung A Le
Attorney, Agent, or Firm—Well, St. John, Roberts, Gregory & Matkin P.S.

[57] ABSTRACT

Semiconductor processing methods, semiconductor processing methods of forming diodes, and semiconductor processing methods of forming Schottky diodes are described. In one embodiment, a first layer of material is formed over a substrate. A second layer of material is formed over the first layer of material. An opening is formed to extend through the first and second layers sufficient to expose a portion of the substrate. An angled ion implant is conducted through the opening and into the substrate. After the conducting of the angled ion implant, the second layer of material is removed. In another embodiment, a diode opening is formed in a layer of material over a semiconductive substrate. In another embodiment, a Schottky diode is formed by forming an opening in a layer of material which is formed over a semiconductive substrate, wherein the opening exposes a substrate portion. An angled ion implant is conducted through the opening and into the semiconductive substrate. A conductive layer of material, e.g. a silicide, is formed within the opening. In another embodiment, a Schottky diode is formed by conducting an angled ion implant of impurity into a semiconductive substrate sufficient to form an impurity ring which is received within the substrate. A conductive Schottky material layer is formed proximate the impurity ring.

26 Claims, 4 Drawing Sheets

6,140,214

SEMICONDUCTOR PROCESSING METHODS, SEMICONDUCTOR PROCESSING METHODS OF FORMING DIODES, AND SEMICONDUCTOR PROCESSING METHODS OF FORMING SCHOTTKY DIODES

TECHNICAL FIELD

This invention relates to semiconductor processing methods, to semiconductor processing methods of forming diodes, and to methods of forming Schottky diodes.

BACKGROUND OF THE INVENTION

Semiconductor processing typically involves forming various devices over a semiconductive substrate. One such device is a diode. Some diode devices comprise pn junctions disposed within a semiconductive substrate. Other types of diodes are Schottky diodes which do not typically comprise the conventional pn junctions disposed within a semiconductive substrate. Specifically, Schottky diodes are typically formed to include a conductive material or metal layer disposed adjacent a diffusion region selected to achieve a desired diode configuration.

During fabrication of integrated circuitry devices, and in particular diodes including the above-mentioned Schottky diode, concerns can arise which are associated with edge effects which can cause undesired current leakage. One cause of edge effects can be sharp or abrupt abutment of a patterned metal or other diffusion region relative to a depletion region adjacently formed in operation.

This invention arose out of concerns associated with providing semiconductor processing methods which improve device operation by reducing undesired edge effects, particularly in the context of forming diodes.

SUMMARY OF THE INVENTION

Semiconductor processing methods, semiconductor processing methods of forming diodes, and semiconductor processing methods of forming Schottky diodes are described. In one embodiment, a first layer of material is formed over a substrate. A second layer of material is formed over the first layer of material. An opening is formed to extend through the first and second layers sufficient to expose a portion of the substrate. An angled ion implant is conducted through the opening and into the substrate. After the conducting of the angled ion implant, the second layer of material is removed. In another embodiment, a diode opening is formed in a layer of material over a semiconductive substrate. In another embodiment, a Schottky diode is formed by forming an opening in a layer of material which is formed over a semiconductive substrate, wherein the opening exposes a substrate portion. An angled ion implant is conducted through the opening and into the semiconductive substrate. A conductive layer of material, e.g. a silicide, is formed within the opening. In another embodiment, a Schottky diode is formed by conducting an angled ion implant of impurity into a semiconductive substrate sufficient to form an impurity ring which is received within the substrate. A conductive Schottky material layer is formed proximate the impurity ring.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
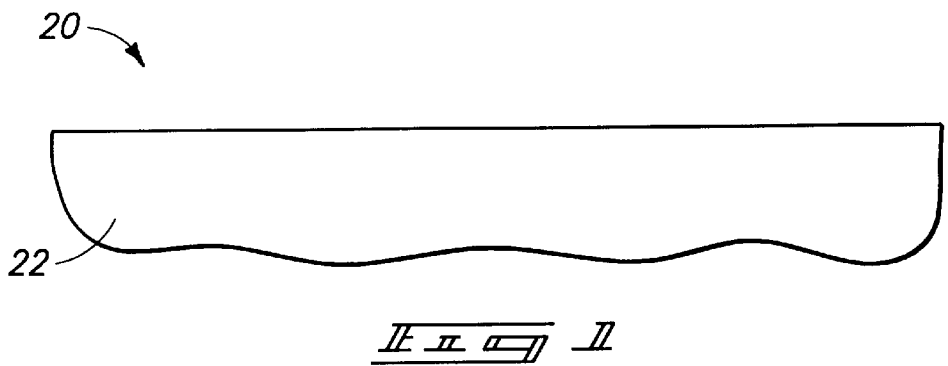
FIG. 1 is a diagrammatic side sectional view of a semiconductor wafer fragment in process in accordance with one embodiment of the invention.

Referring to FIG. 1, a semiconductor wafer fragment in process is shown generally at 20 and includes a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one embodiment substrate 22 predominantly comprises a first-type of dopant or material which is preferably n-type dopant or material.

Figure 2:
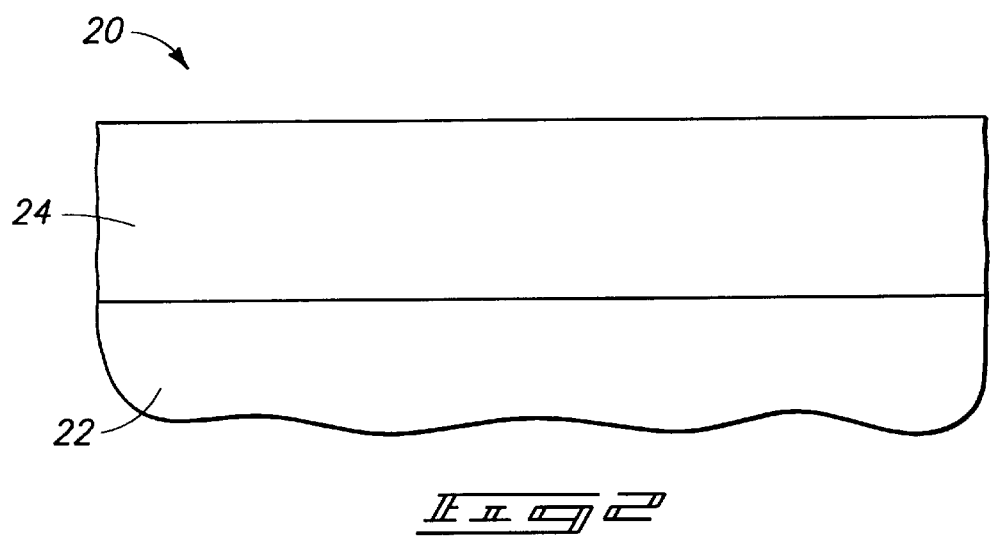
FIG. 2 is a view of the FIG. 1 wafer fragment at a processing step which is subsequent to that which is shown in FIG. 1.

Referring to FIG. 2, a first layer of material is formed over substrate 22. In one embodiment, layer 24 comprises an oxide layer.

Figure 3:
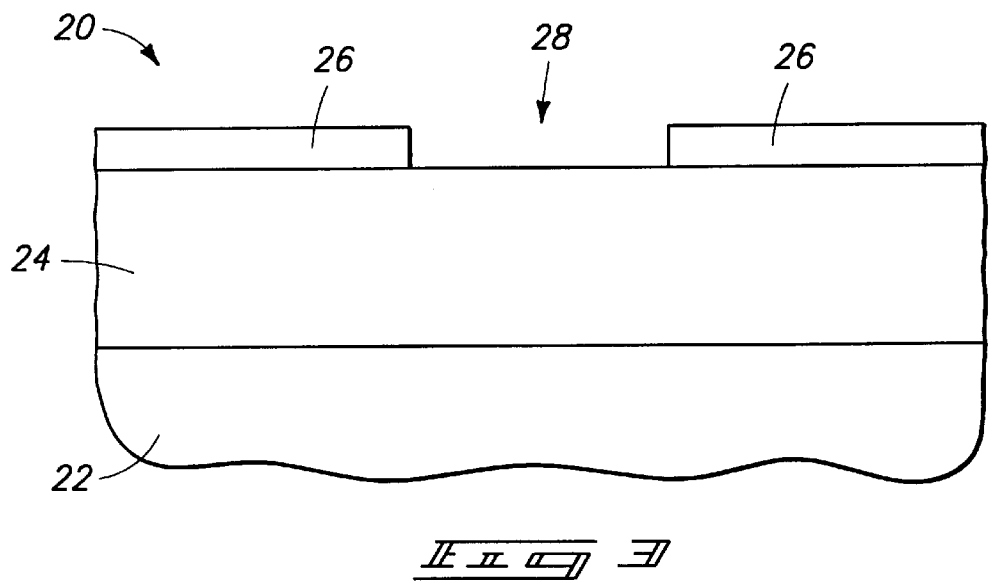
FIG. 3 is a view of the FIG. 1 wafer fragment at a processing step which is subsequent to that which is shown in FIG. 2.

Referring to FIG. 3, a second layer of material 26 is formed over first layer of material 24. An exemplary material is photoresist. An opening 28 is formed in layer 26 over first layer 24.

Figure 4:
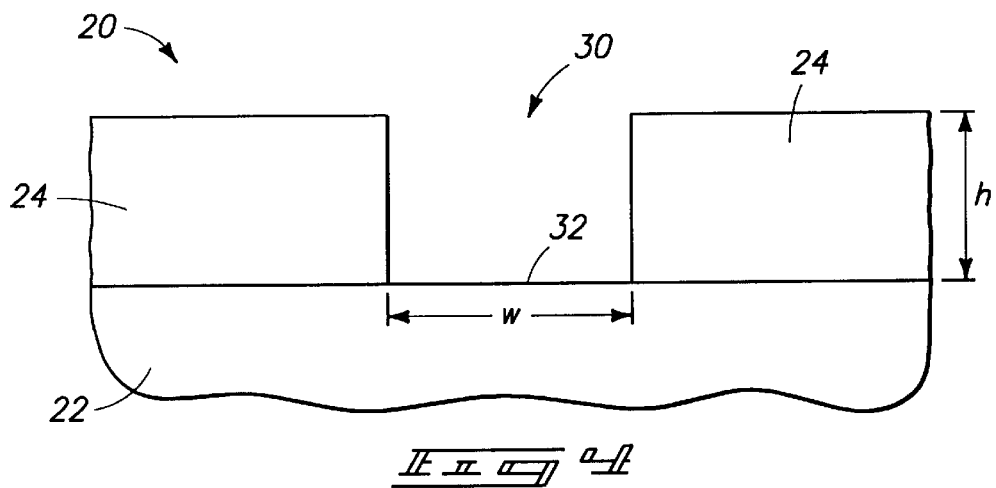
FIG. 4 is a view of the FIG. 1 wafer fragment at a processing step which is subsequent to that which is shown in FIG. 3.

Referring to FIG. 4, an opening 30 is formed to extend through first layer 24 over substrate 22. In one embodiment, opening 30 comprises a diode opening which exposes a substrate portion 32. Opening 30 is formed to have a height h and a width w. The height and width define an aspect ratio which is a ratio of height-to-width. An exemplary width is less than about 0.18 micron. More preferably, an exemplary width is from between about 0.05 micron to 0.18 micron.

Figure 5:
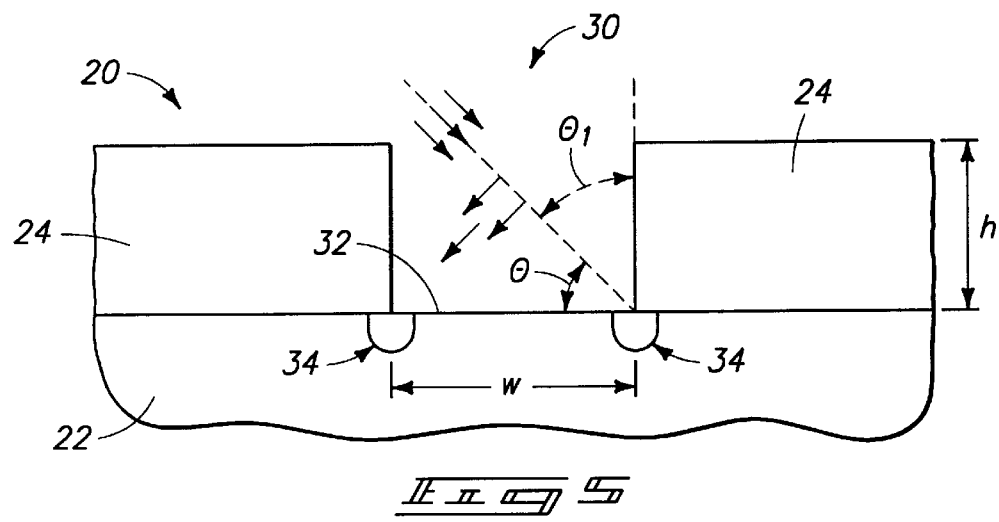
FIG. 5 is a view of the FIG. 1 wafer fragment at a different processing step.

Referring to FIG. 5, an angled ion implant of impurity is conducted through diode opening 30 and into substrate 22. In one embodiment, the impurity used to conduct the implant comprises a second-type of dopant which is different from the first-type of dopant. Accordingly, where substrate 22 predominantly comprises n-type dopant, the implanted impurity would comprise a p-type dopant. In one embodiment, the angled ion implant is conducted sufficiently to form a ring 34 of dopant which is received within substrate 22 proximate opening 30. In another embodiment, the angled ion implant is conducted at an angle $\theta_1$ away from normal to the substrate, with such angle being a function of the dimension of the opening, e.g. a function of at least one of the height h and the width w of diode opening 30.

Preferably, the angled ion implant is conducted within a desired range of a selected or calculated angle $\theta_1$. In one preferred embodiment, $\theta_1$ is calculated to equal 90°−θ, where θ is approximately equal to $\tan^{-1}$ (height/weight); and the angled ion implant is conducted at an angle which is within a desired range of the calculated angle $\theta_1$. In another preferred embodiment such range is within 5° of the calculated value for $\theta_1$.

Figure 6:
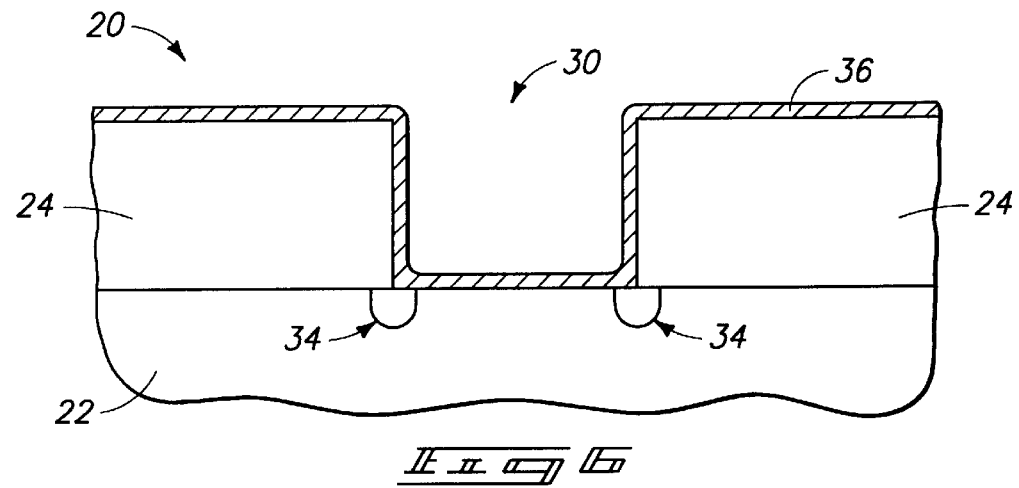
FIG. 6 is a view of the FIG. 1 wafer fragment at a different processing step.

Referring to FIG. 6, a conductive Schottky material layer 36 is formed proximate the impurity ring. Exemplary materials include aluminum, platinum, titanium, and the like. In a preferred embodiment, a layer of refractory metal material is formed, with titanium being preferred.

Figure 7:
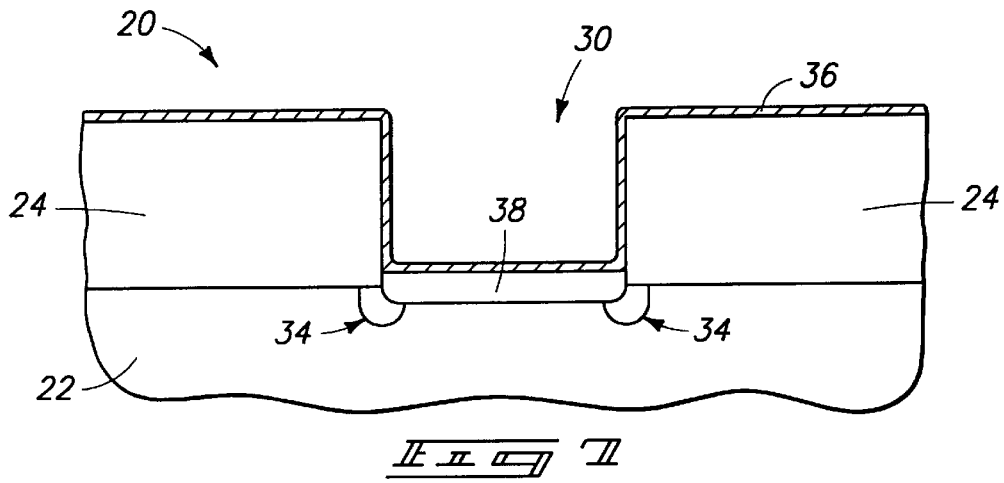
FIG. 7 is a view of the FIG. 1 wafer fragment at a processing step which is subsequent to that which is shown in FIG. 6.

Referring to FIG. 7, layer 36 is exposed to conditions which are effective to render at least a portion thereof into a silicide layer 38. For example, after formation of the preferred titanium layer, it is subjected to rapid thermal processing (RTP) at temperatures between 550° C. and 650° C., in an $N_2$ ambient for around 20 seconds, with a ramp rate of 100° C. per second. Such processing enables layer 36 material directly over the exposed substrate to be converted into a silicide, while converting other portions of the layer, e.g. those portions over layer 24, into titanium nitride. Of course, other methods can be used to provide silicide layer 38. In this example, provision of the silicide layer 38 takes place after conducting the angled ion implant.

Figure 8:
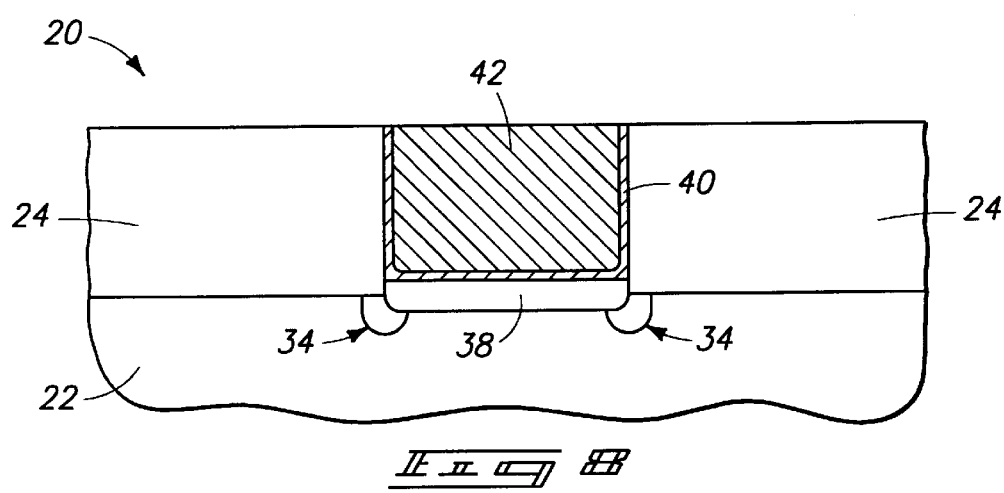
FIG. 8 is a view of the FIG. 1 wafer fragment at a processing step which is subsequent to that which is shown in FIG. 7.

Referring to FIG. 8, unreacted refractory metal is removed from over the substrate. A wet piranha strip, e.g. water, hydrogen peroxide and $H_2SO_4$, at around 80° C. is one example process that will strip unreacted material. Subsequently, an anneal of the substrate can take place at around 800° C. to 850° C. in $N_2$, for 20 seconds with a ramp rate of 100° per second to further stabilize the formed film.

A conductive layer 40 is formed over substrate and within opening 30. In a preferred embodiment layer 40 comprises TiN which less than fills opening 30. Remaining opening portions are subsequently filled with a different conductive material, preferably tungsten 42. Accordingly, a Schottky diode is provided having a conductive layer 38 provided over a substrate 22. A ring 34 is provided within the substrate and mitigates edge effects which can cause undesired current leakage.

Figure 9:
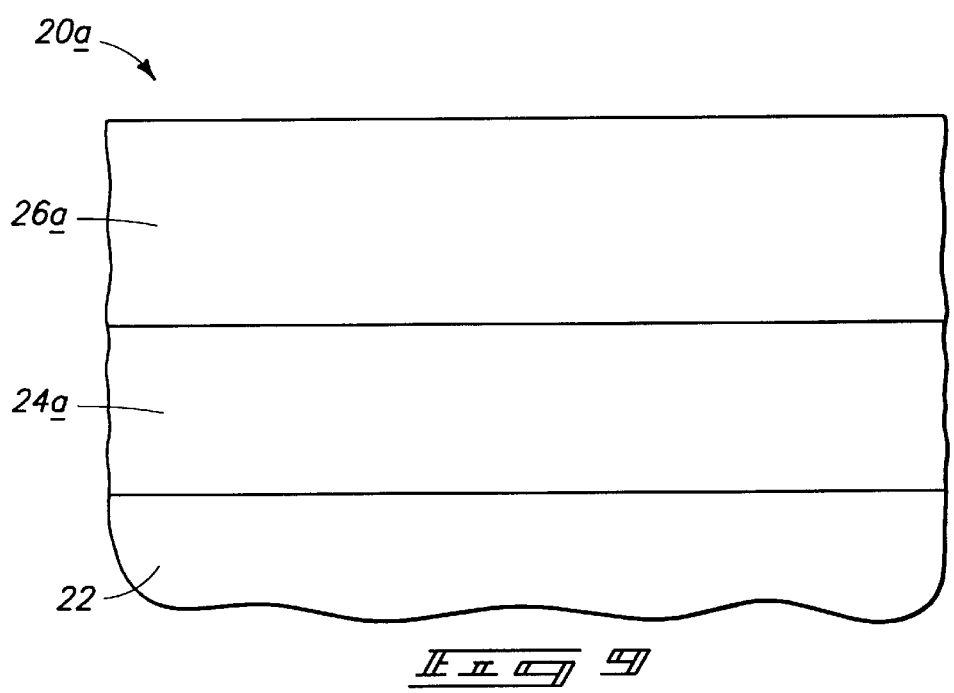
FIG. 9 is a diagrammatic side sectional view of a semiconductor wafer fragment in process in accordance with another embodiment of the present invention.
Figure 10:
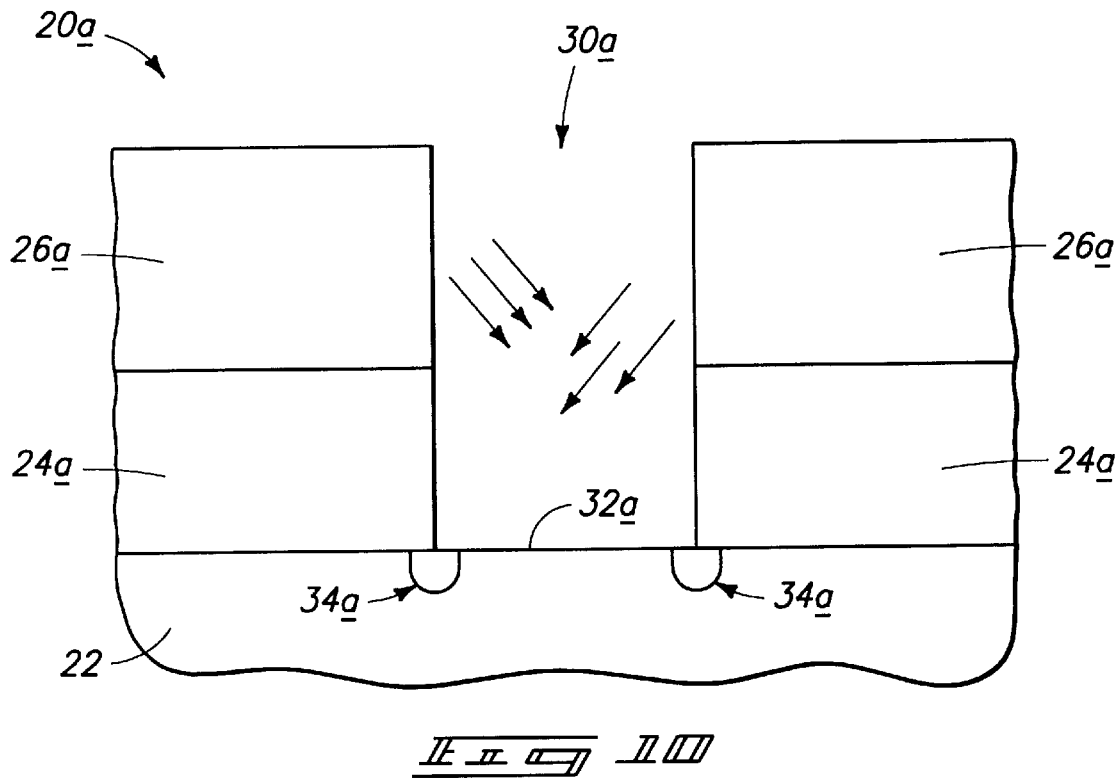
FIG. 10 is a view of the FIG. 9 wafer fragment at a processing step which is subsequent to that which is shown in FIG. 9.
Figure 11:
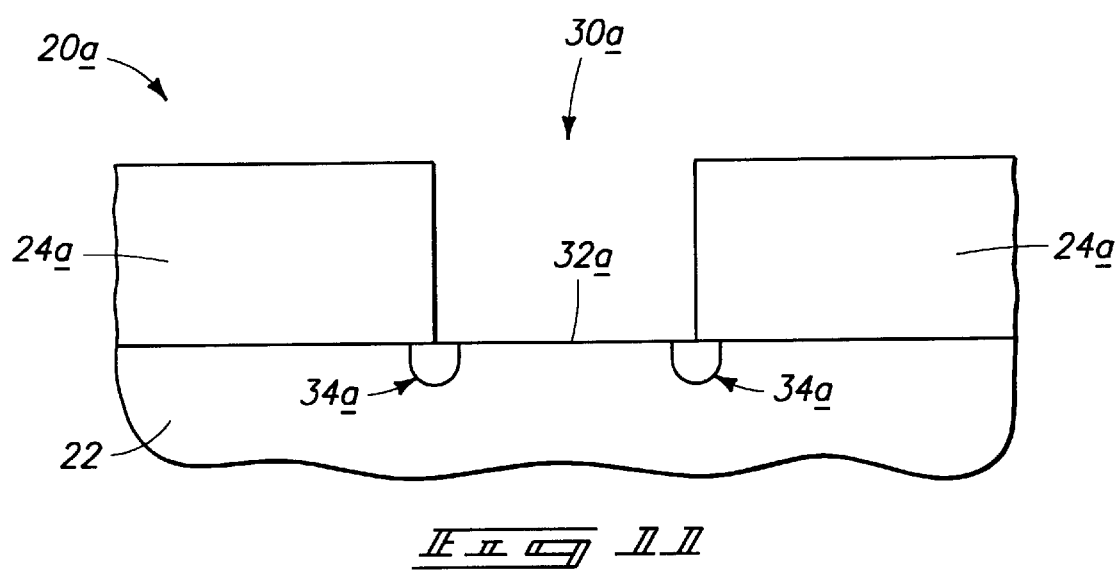
FIG. 11 is a view of the FIG. 9 wafer fragment at a processing step which is subsequent to that which is shown in FIG. 10.

Referring to FIGS. 9–11, a semiconductor wafer fragment in accordance with another embodiment of the invention is shown generally at 20a and comprises substrate 22. Like numerals from the above-described embodiment have been utilized where appropriate with differences being indicated by the suffix "a" or with different numerals.

A first layer 24a is formed over substrate 22 and a second layer 26a is formed over first layer 24a. Layer 24a can comprise an oxide layer while layer 26a can comprise a sacrificial layer of photoresist. An opening 30a is formed to extend through first and second layers 24a, 26a sufficient to expose a portion 32a of substrate 22. An angled ion implant is conducted through opening 32a and into substrate 22. Such preferably forms a ring 34a which is received within the substrate proximate opening 30a. After conducting the angled ion implant, second layer 26a is removed (FIG. 11). In accordance with one embodiment, subsequent processing can take place substantially as described above with respect to FIGS. 6–8.

The methods described above can facilitate formation of semiconductor devices. In particular, and in the context of diode devices, edge effects associated with abrupt transitions between patterned metal or other diffusion regions relative to a depletion region can be reduced. In operation, integrated circuitry formed in accordance with the above-described methods can be used in the context of DRAM circuitry for such things as band gap reference circuits. In the context of other integrated circuitry scenarios, integrated circuitry formed in accordance with the above-described methods can be used for reference voltage circuits in various other circuitry configurations. Other advantages provided by the various methods described above include process simplicity, optimization of device characteristics, and miniaturization or reduction in device dimensions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a diode comprising:

forming a diode opening in a layer of material formed over a semiconductive substrate;

conducting an angled ion implant of impurity through the opening and into the semiconductive substrate; and forming a layer comprising titanium over the substrate and within the diode opening and exposing the titanium comprising layer to conditions effective to render at least a portion thereof into a titanium silicide layer.

2. The semiconductor processing method of claim 1 further comprising forming conductive material over the substrate and within the diode opening.

3. The semiconductor processing method of claim 1 further comprising forming conductive material over the substrate and within the diode opening, and wherein the conducting of the angled ion implant takes place prior to said forming of the conductive material.

4. The semiconductor processing method of claim 1, wherein said layer of material comprises an oxide material and said forming of the diode opening comprises forming said opening to have a height and a width, and wherein said conducting of said angled ion implant comprises conducting said implant at an angle $\theta_1$ away from normal to the substrate which is a function of at least one of the height and the width of the diode opening.

5. The semiconductor processing method of claim 1, wherein said layer of material comprises an oxide material and said forming of the diode opening comprises forming said opening to have a height and a width, and wherein said conducting of said angled ion implant comprises conducting said implant at an angle $\theta_1$ away from normal to the substrate, wherein $\theta_1$ is approximately equal to $(90°-\theta)$, where $\theta=\tan^{-1}$ (height/width).

6. The semiconductor processing method of claim 1, wherein the substrate predominately comprises a first type of dopant, and said conducting of the angled ion implant comprises using a second type of dopant which is different from the first type of dopant.

7. A semiconductor processing method of forming a Schottky diode comprising:
 forming an opening in a layer of material formed over a semiconductive substrate, the opening exposing a substrate portion;
 conducting an angled ion implant of impurity through the opening and into the semiconductive substrate;
 forming a layer comprising a refractory metal silicide forming material over the substrate and exposing the layer to conditions where at least some of the layer is rendered into a layer comprising a refractory metal silicide, the silicide layer within the opening; and
 forming a layer of titanium nitride within the opening.

8. The semiconductor processing method of claim 7, wherein said layer of material comprises oxide.

9. The semiconductor processing method of claim 7 further comprising forming said layer comprising silicide after said conducting of the angled ion implant.

10. The semiconductor processing method of claim 7, wherein said forming of the layer comprising a refractory metal silicide forming material comprises forming a layer comprising titanium over the substrate.

11. The semiconductor processing method of claim 7, wherein said conducting of the angled ion implant comprises selecting an angle $\theta_1$ at which to conduct said implant which is a function of the dimension of the said opening, and conducting said implant at an angle which is within a desired range of said selected angle.

12. The semiconductor processing method of claim 7, wherein said forming of the opening comprises forming said opening to have a height and a width, and wherein said conducting of the angled ion implant comprises calculating an angle $\theta_1$ at which to conduct said implant, said angle being away from normal to the substrate, wherein $\theta_1=(90°-\theta)$, where $\theta$ is approximately equal to $\tan^{-1}$(height/width), and further comprising conducting said implant at n angle which is within a desired range of said calculated angle $\theta_1$.

13. The semiconductor processing method of claim 12, wherein said conducting of said angled ion implant takes place within a range of 5° of the calculated value for $\theta_1$.

14. A semiconductor processing method of forming a Schottky diode comprising:
 exposing a portion of a semiconductive substrate;
 conducting an angled ion implant of impurity into the semiconductive substrate sufficient to form a ring comprising the impurity received within the substrate, the ring proximate the exposed portion;
 forming a conductive Schottky material layer proximate the impurity ring and within the exposed portion; and
 forming a layer of titanium nitride over the Schottky material layer.

15. The semiconductor processing method of claim 14, wherein said forming of said conductive Schottky material layer comprises forming a silicide layer proximate the impurity ring.

16. The semiconductor processing method of claim 14, wherein said forming of said conductive Schottky material layer comprises forming a refractory metal layer over the substrate and subjecting the refractory metal layer to conditions effective to render at least a portion thereof into a silicide layer proximate the impurity ring.

17. The semiconductor processing method of claim 14, wherein said forming of said conductive Schottky material layer comprises forming a refractory metal layer over the substrate and subjecting the refractory metal layer to conditions effective to render at least a portion thereof into a silicide layer proximate the impurity ring, and further comprising removing portions of the refractory metal layer which were not rendered into the silicide layer.

18. The semiconductor processing method of claim 14 further comprising prior to the conducting of the angled ion implant, forming an opening through a material over the substrate, the opening having a height and a width, and wherein the conducting of the angled ion implant comprises calculating an angle $\theta_1$ away from normal to the substrate, where $\theta_1=(90°-\theta)$, where $\theta$ is approximately equal to $\tan^{-1}$ (height/width), and conducting said implant at an angle which is within a desired range of said calculated angle.

19. A semiconductor processing method comprising:
 forming a first layer of material over a substrate;
 forming a second layer of material over the first layer of material;
 forming an opening extending through the first and second layers sufficient to expose a portion of the substrate;
 conducting an angled ion implant of impurity through the opening and into the substrate;
 after said conducting, removing the second layer of material; and
 after removing the second layer of material, forming a layer of refractory metal disposed over the substrate, the refractory metal layer comprising titanium.

20. The semiconductor processing method of claim 19, wherein the forming of the first layer comprises forming an oxide layer over the substrate.

21. The semiconductor processing method of claim 19, wherein:
 the forming of the first layer comprises forming an oxide layer over the substrate; and
 the forming of the second layer comprises forming a masking layer over the first layer.

22. The semiconductor processing method of claim 19, wherein:
 the forming of the first layer comprises forming an oxide layer over the substrate; and
 the forming of the second layer comprises forming a photoresist layer over the first layer.

23. The semiconductor processing method of claim 19, wherein said forming of said opening comprises forming an opening within which a diode is to be formed.

24. The semiconductor processing method of claim 19, wherein:
 said forming of said opening comprises forming an opening within which a diode is to be formed; and
 after forming said opening, forming a conductive Schottky material within said opening.

25. The semiconductor processing method of claim 19, wherein:
 said forming of said opening comprises forming an opening within which a diode is to be formed; and after conducting said angled ion implant, forming a conductive Schottky material within said opening.

26. A method of forming a Schottky diode comprising:

providing a substrate predominately comprising n-type dopant;

forming an oxide layer over the substrate;

forming an opening through the oxide layer and exposing a portion of the substrate;

conducting an angled ion implant using a p-type dopant sufficient to form a ring of p-type dopant received within the substrate proximate the opening;

after said conducting, forming a refractory metal layer over the substrate and within the opening;

exposing the substrate to conditions effective to render at least a portion of the refractory metal layer into a silicide within the opening;

removing unreacted refractory metal layer material;

forming a layer of TiN within the opening to less than fill the opening; and filling remaining opening portions with tungsten.

* * * * *